(12) United States Patent
Kim et al.

(10) Patent No.: US 7,168,017 B2
(45) Date of Patent: Jan. 23, 2007

(54) MEMORY DEVICES WITH SELECTIVELY ENABLED OUTPUT CIRCUITS FOR TEST MODE AND METHOD OF TESTING THE SAME

(75) Inventors: Sung-ryul Kim, Kyungki-do (KR); Jong-bok Tcho, Kyungki-do (KR); Woo-seop Jeong, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 605 days.

(21) Appl. No.: 10/648,086

(22) Filed: Aug. 26, 2003

(65) Prior Publication Data

US 2004/0042312 A1  Mar. 4, 2004

(30) Foreign Application Priority Data

Aug. 29, 2002  (KR) .................. 10-2002-0051532

(51) Int. Cl.
*G11C 29/00* (2006.01)
(52) U.S. Cl. .................. 714/718; 365/201; 714/30; 714/724
(58) Field of Classification Search .............. None
See application file for complete search history.

(56) References Cited

U.S. PATENT DOCUMENTS

| | | | |
|---|---|---|---|
| 4,495,603 A | * | 1/1985 | Varshney .................. 365/233 |
| 5,293,386 A | * | 3/1994 | Muhmenthaler et al. ..... 714/718 |
| 5,910,923 A | * | 6/1999 | Brown et al. ............. 365/201 |
| 2003/0110428 A1 | * | 6/2003 | Ochoa et al. ............. 714/724 |

* cited by examiner

*Primary Examiner*—Albert Decady
*Assistant Examiner*—John P. Trimmings
(74) *Attorney, Agent, or Firm*—Myers Bigel Sibley Sajovec PA

(57) ABSTRACT

A memory device, such as a DDR SDRAM, may be provided in which subsets of data output circuits of the device can be selectively enabled to allow sets of data output pins to be connected in common in a testing configuration. In some embodiments, a memory device includes a plurality of data output circuits, respective ones of which are configured to receive data from respective internal data lines and respective ones of which are coupled to respective data input/output pins. The device further includes a data output control circuit operative to selectively enable subsets of the plurality of data output circuits to drive their respective corresponding data input/output pins responsive to an externally-applied control signal. The data output control circuit may be operative to selectively cause subsets of the plurality of data output circuits to present a high impedance at their respective corresponding data input/output pins. The invention may be embodied as devices and methods.

14 Claims, 11 Drawing Sheets

MEMORY DEVICES WITH SELECTIVELY ENABLED OUTPUT CIRCUITS FOR TEST MODE AND METHOD OF TESTING THE SAME

RELATED APPLICATION

This application claims the benefit of Korean Patent Application No. 2002-51532, filed on Aug. 29, 2002, which is incorporated herein in its entirety by reference.

BACKGROUND OF THE INVENTION

The present invention relates to memory devices and methods of testing thereof, and more particularly, to memory devices having an internal circuit for improving test efficiency and a method of testing thereof.

In general, semiconductor memory devices are tested before sale to users. The time taken to perform tests can cause an increase in the cost of the product. Therefore, many efforts have been made to shorten the time needed for testing. As it can be difficult to reduce the number of items tested in a memory device, a plurality of devices are typically tested in parallel to reduce the total time needed for testing. As a result, the time necessary for testing can be reduced in proportion to the number of products that can be simultaneously tested by a testing instrument.

A typical semiconductor memory device includes a plurality of data input/output pins for inputting/outputting binary data and a plurality of control pins for controlling the semiconductor memory device. When testing such a semiconductor memory device, the control and input/output pins of the test instrument typically are connected to data input/output pins and control pins of the semiconductor memory device. When multiple devices are tested in parallel, a control signal may be applied to the control pins of multiple devices.

However, a data output signal of the semiconductor memory device may vary depending on the product. Conventionally, this may mean that all of the data input/output pins of each product to be tested are required to be connected to input/output pins of the testing instrument in a one-to-one relationship. Therefore, the number of simultaneously testable products is typically determined according to the number of data input/output pins of each product.

Semiconductor memory devices can be classified, for example, as X4 products, X8 products or X16 products based on the amount of binary data that can be input/output at a time. A X4 product includes four data input/output pins to process four data bits at a time. An X8 product includes eight data input/output pins to process eight data bits at a time. An X16 product includes sixteen data input/output pins to process sixteen data bits at a time. The number of data input/output pins of an X16 product is double the number of data input/output pins of an X8 product and, therefore, the number of X16 products that are simultaneously testable in a given testing instrument may be half the number of X8 products can be simultaneously tested in the testing instrument.

FIG. 1 shows a X16 semiconductor memory device connected to a testing instrument. In particular, FIG. 1 is a block diagram showing connections of conventional DDR SDRAMs 10 (double data rate synchronous DRAM) to a DRAM testing instrument 20. Control signal input pins 11 of the X16 DDR SDRAMs 10 are connected to control signal output pins 21 of the DRAM testing instrument 20. Data input/output pins 12 of the X16 DDR SDRAMs 10 are similarly connected to data input/output pins 22 of the DRAM testing instrument 20 in a one-to-one fashion. The X16 DDR SDRAMs 10 output data to or input data from the data input/output pins 22 of the DRAM testing instrument 20 through the data input/output pins 12 based on a control signal output from the DRAM testing instrument 20. The DRAM testing instrument 20 checks data input to the data input/output pins 22 and received from the data input/output pins 22 to verify whether the DDR SDRAMs are faulty. Because the data input/output pins 12 of the X16 DDR SDRAM are connected to the data input/output pins 22 of the DRAM testing instrument 20 in a one-to-one relationship, the number of X16 DDR SDRAM that be simultaneously tested is considerably limited in comparison to the number of the X8 DDR SDRAM that can be simultaneously tested.

FIG. 2 is a block diagram of an internal circuit of a DDR SDRAM such as those shown in the FIG. 1. An internal circuit 30 of the DDR SDRAM includes an internal circuit decision unit 31, a command decoder 32, a control signal generator 33, a first input buffer 34, a second input buffer 35, a DQ (data input/output) buffer controller 36, a first write controller 37, a second write controller 38, a plurality of DQ buffers 39, and a plurality of drivers 40. The internal circuit decision unit 31 outputs a control signal PINOUT and determines a number of input/output data pins of the DDR SDRAM and the internal circuit corresponding thereto. The command decoder 32 outputs a plurality of control commands in response to externally input control signals C0, C1, . . . , CX. The control signal generator 33 activates a control signal PBUFEN (not shown) in response to a data write command WRITE output from the command decoder 32 and outputs the activated control signal PBUFEN.

The control signal PBUFEN causes the first input buffer 34 and the second input buffer 35 to turn on or off. The first input buffer 34 and the second input buffer 35 are turned on as the control signal PBUFEN is activated. The first input buffer 34 and the second input buffer 35 activate control signals UDMT and LDMT respectively, in response to input external write inhibit signals UDM and LDM. The first write controller 37 and the second write controller 38 operate based on the control signals UDMT and LDMT.

The first write controller 37 and the second write controller 38 control write operations for data input to the eight data input/output pins 12. More specifically, when the control signal UDMT is in a de-asserted state, the first write controller 37 prevents data present at the eight data input/output pins 12, which are controlled by the first write controller 37, from being written in a memory cell (not shown). When the control signal LDMT is in a de-asserted state, the second write controller 38 prevent data at the eight data input/output pins 12, which are controlled by the second write controller 38, from being written in the memory cell.

The first input buffer 34, the second input buffer 35, the first write controller 37, the second write controller 38, and the control signal generator 33 are not used in a test mode of the DDR SDRAM, but are used in a data write operation of the DDR SDRAM. The DQ buffer controller 36 outputs a control signal PTRST in response to a data read command signal READ that is output from the command decoder 32. The control signal PTRST is asserted in response to the data read command signal READ and is then de-asserted after a predetermined time. If the control signal PTRST is asserted, data is output from the data input/output pins 12.

The DQ buffers 39 are connected to the data input/output pins 12 via the drivers 40. All of the DQ buffers 39 are turned on or off according to the control signal PINOUT. If the control signal PTRST is asserted, the plurality of DQ buffers 39 generate internal signals by synchronizing data in a memory cell, i.e., the data produced DO0, DO1, DO2, . . . , DO15 on internal data lines 14, to external clock signals. The plurality of drivers 40 receive the internal signals and output them as data, i.e., DQ0, DQ1, DQ2, . . . , DQ15, via the data input/output pins 12. If the control signal PTRST is de-asserted, the DQ buffers 39 and the drivers 40 transition to a high impedance state, and as a result, data DQ0, DQ1, DQ2, . . . , DQ15 is not output. In order to output the data, DO0, DO1, DO2, . . . , DO15, at a high speed to a large external load capacitance, the plurality of drivers 40 provide an increased current sourcing/sinking capabilities for data pins 12. The plurality of drivers 40 output the data, DO0, DO1, . . . , DO15, as the data, DQ0, DQ1, DQ2, . . . , DQ15, via the data input/output pins 12.

FIG. 3 is a timing chart showing signals of the DDR SDRAM shown in FIG. 2 in a test mode of the DDR SDRAM. In the test mode, if the command decoder 32 outputs a data read command signal READ in synchronization with a clock signal CLK, the DQ buffer controller 36 responds to the data read command signal READ and asserts the control signal PTRST. As the control signal PTRST is asserted, the DQ buffers 39 are turned on to activate the drivers 40, and data, DQ0, DQ1, DQ2, . . . , DQ15, are output through the drivers 40. Because the control signal generator 33, the first input buffer 34 and the second input buffer 35 are not used in the test mode of the DDR SDRAM, the control signal PBUFEN is in a deactivated state. In addition, because the write inhibit signals UDM and LDM are not activated, the control signals UDMT and LDMT are also not activated.

As described above, because the data input/output pins of the conventional DDR SDRAM are typically connected to the data input/output pins of the testing instrument in a one-to-one relationship, the number of products that are simultaneously testable can be limited. Therefore, there exists a need for reducing the number of data input/output pins of a semiconductor memory device used in testing, in order to increase the number of semiconductor memory devices that can be simultaneously tested with a single testing instrument.

SUMMARY OF THE INVENTION

According to some embodiments of the present invention, a memory device, such as a DDR SDRAM, may be provided in which subsets of data output circuits of the device can be selectively enabled to allow sets of data output pins to be connected in common in a testing configuration. In some embodiments, a memory device includes a plurality of data output circuits, respective ones of which are configured to receive data from respective internal data lines and respective ones of which are coupled to respective data input/output pins. The device further includes a data output control circuit operative to selectively enable subsets of the plurality of data output circuits to drive their respective corresponding data input/output pins responsive to an externally-applied control signal. The data output control circuit may be operative to selectively cause subsets of the plurality of data output circuits to present a high impedance at their respective corresponding data input/output pins, such that data input/output pins can be connected in common in a test configuration.

In further embodiments of the present invention, the data output control comprises a command decoder operative to generate test mode command signals and read command signals responsive to first externally-applied control signals, and a data output selection circuit coupled to the command decoder and operative to selectively enable subsets of the plurality of data output circuits responsive to the test mode command signals, the read command signals, and second externally-supplied control signals. The data output selection circuit may include a data output controller circuit configured to receive a plurality of group control signals and operative to generate respective output control signals responsive to respective ones of the group control signals, and a plurality of write inhibit signal buffer circuits, respective ones of which are configured to receive respective ones of a plurality of externally-applied write inhibit signals and operative to generate respective ones of the group control signals therefrom. Respective subsets of the plurality of data output circuits may be configured to receive respective ones of the output control signals and may be operative to be enabled and disabled responsive thereto. According to further embodiments, the data output controller circuit may include a first output controller circuit that applies an enable signal to all of the plurality of data output circuits responsive to read command signals generated by the command decoder, a second output controller circuit that receives a first group control signal and that generates a first group enable signal for a first subset of the plurality of data output circuits, and a third output controller circuit that receives a second group control signal and that generates a second group enable signal for a second subset of the plurality of data output circuits.

In other embodiments of the present invention, the data output control circuit further comprises an write inhibit signal buffer control circuit operative to enable the plurality of write inhibit signal buffer circuits responsive to a test mode command signal generated by the command decoder. The write inhibit signal buffer control circuit may include a control signal generator circuit which outputs a write inhibit signal buffer control signal in response to a data write command signal from the command decoder, and a logic circuit that logically combines the write inhibit signal buffer control signal and the test mode command signal and responsively applies a write inhibit signal buffer enable signal to the plurality of write inhibit signal buffer circuits.

A write inhibit signal buffer circuit of the plurality of write inhibit signal buffer circuits may include a voltage comparison circuit which, in response to first state of a first write inhibit buffer enable signal, compares a write inhibit signal to a reference voltage and outputs a first group control signal responsive to the comparison. The write inhibit signal buffer circuit may further include an output control circuit which, in response to a second state of the first write inhibit signal buffer control signal, forces the first group control signal to a signal ground voltage. A data output circuit of the plurality of data output circuits may include a data input/output (DQ) buffer circuit configured to receive data from an internal data line and a output control signal from the data output controller circuit and operative to generate a synchronized data signal synchronized to the external clock signal in response thereto, and a driver circuit that drives an input/output pin responsive to the synchronized data signal.

The present invention may also be embodied as methods of testing a memory device. In particular, in some embodiments of the present invention, a memory device comprising a plurality of data output circuits, respective ones of which are configured to receive data from respective internal data lines and respective ones of which are coupled to respective input/output pins of the memory device, is tested by applying a control signal to the memory device to selectively enable a subset of the plurality of data output circuits to drive a load at their respective corresponding output pins. Input/output pins coupled to first and second data output circuits of respective first and second subsets of the plurality of data output circuits may be connected in common to an external data line. The first and second data output circuits may be alternately enabled responsive to the control signal to drive the external data line with data from first and second different internal data lines of the memory device. The first data output circuit may present a high impedance to the external data line when the second data output circuit is enabled.

DETAILED DESCRIPTION

Figure 1:
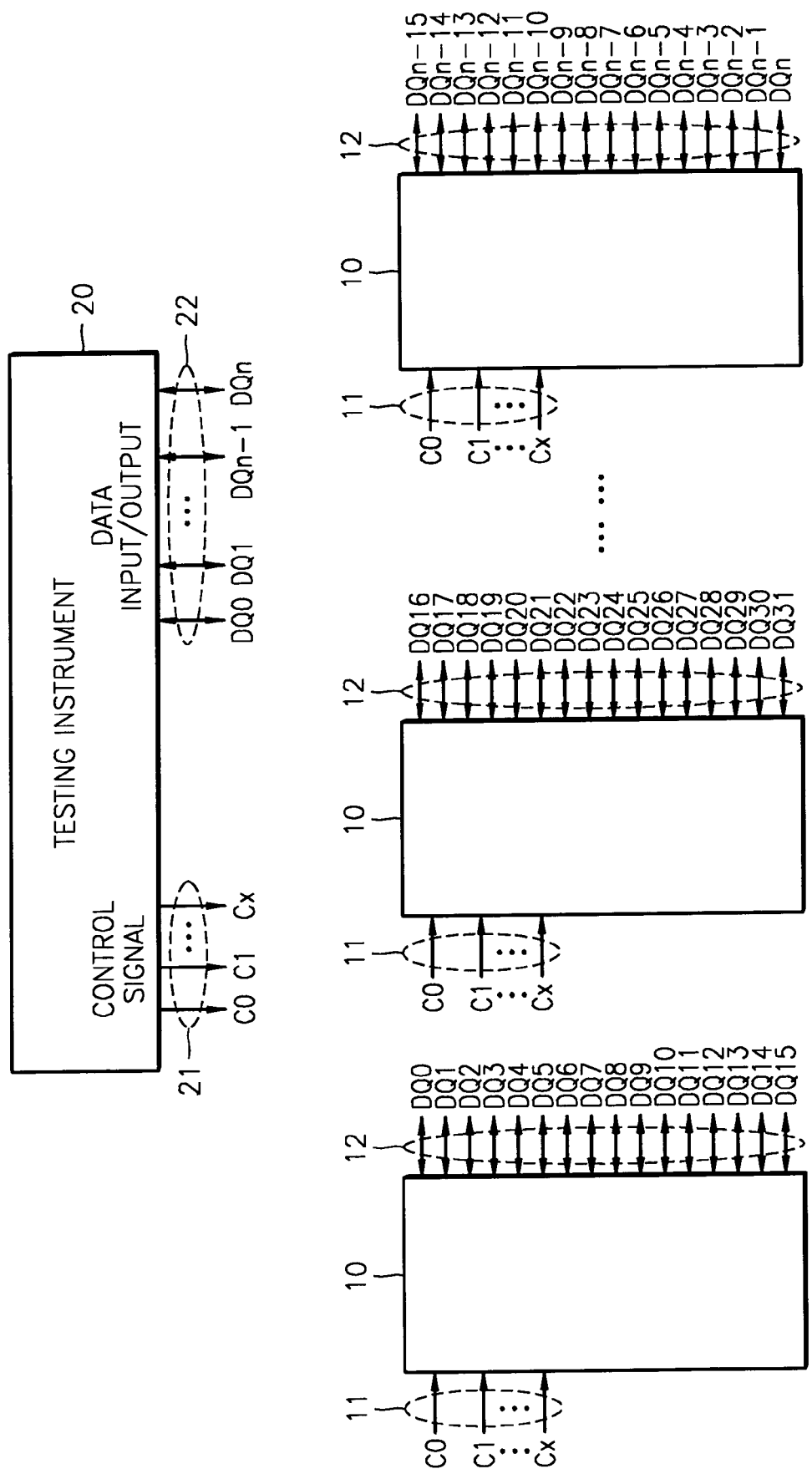
FIG. 1 is a block diagram showing connections of conventional DDR SDRAMs to a testing instrument.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Figure 4:
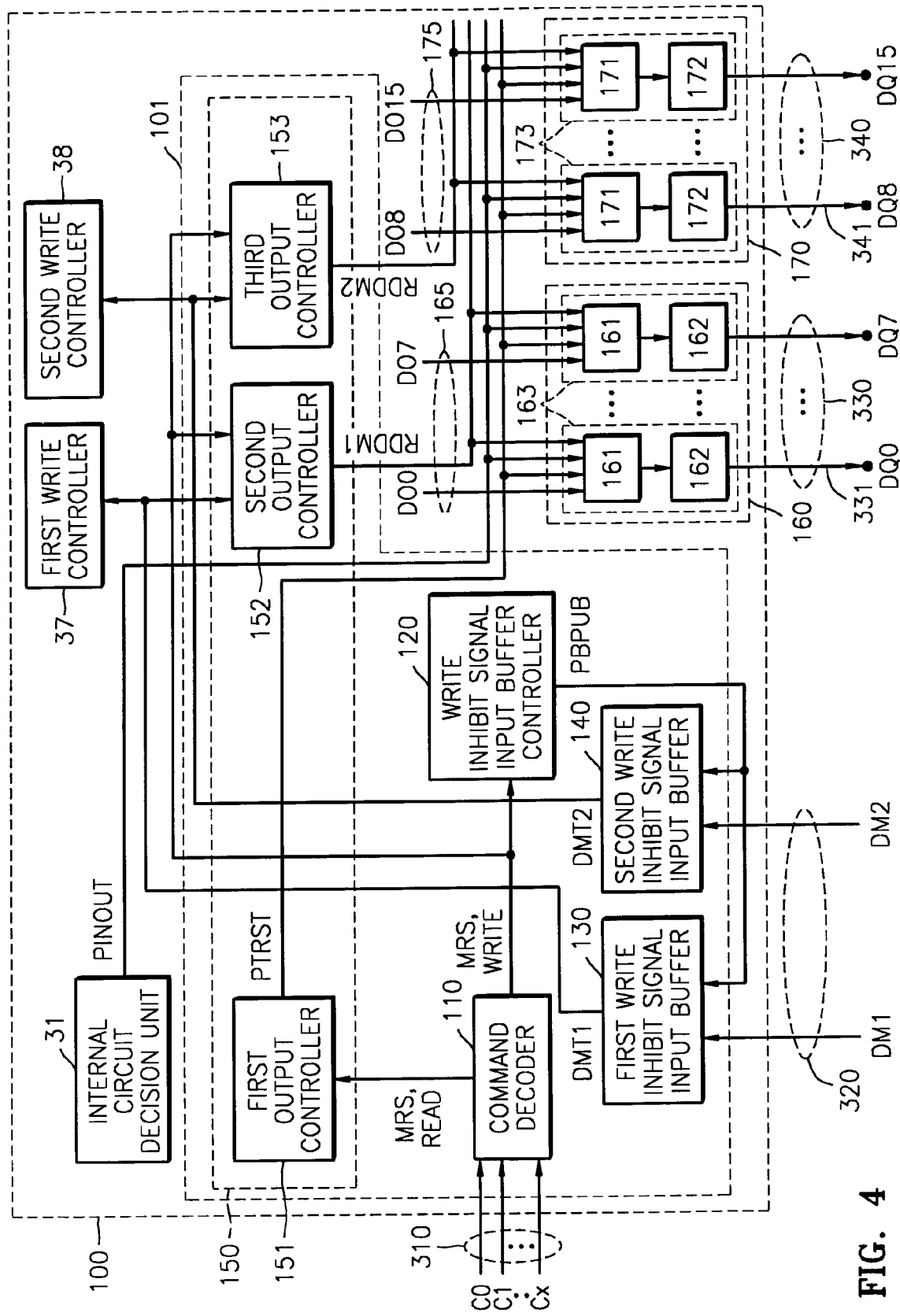
FIG. 4 is a block diagram of an internal circuit of a DDR SDRAM according to some embodiments of the present invention.

FIG. 4 is a block diagram of portions of a DDR SDRAM according to some embodiments of the present invention. As shown in FIG. 4, an internal circuit 100 includes a data output control circuit 101 including a command decoder 110, a write inhibit signal input buffer controller 120 that controls first and second write inhibit signal input buffers 130, 140 that receive external write inhibit signals DM1, DM2, and a data output selection circuit 150. First and second data output units 160, 170 include first and second sets of data output circuits including DQ buffer circuits 161, 171 and driver circuits 162, 172. The internal circuit 100 further includes an internal circuit decision unit 31, a first write controller 37 and a second write controller 38. Other portions of the memory device such as memory cells, sense amplifiers, etc., are not shown for clarity of illustration, and will not be discussed in detail, as their operations are known to those skilled in the art. It will be appreciated that, although the discussion herein relates to DDR SDRAMs, the invention is applicable to other memory devices, including hybrid devices that include memory.

The command decoder 110 includes a plurality of control signal input pins 310 for inputting external control signals. The command decoder 110 outputs a plurality of internal control signals in response to the input of external control signals, CO, C1, . . . , CX, via the control signal input pins 310. The external control signals, CO, C1, . . . , CX, include a chip selection signal (/CS), a row address strobe signal (/RAS), a column address strobe signal (/CAS), and a write enable signal (/WE). The plurality of internal control signals include an MRS (which can indicate whether the device is in a test mode) signal MRS, a data read signal READ, and a data write signal WRITE.

The MRS signal MRS commands the DDR SDRAM between normal and test modes. The write inhibit signal input buffer controller 120 activates a control signal PBPUB in response to assertion of the MRS signal MRS. The control signal PBPUB controls the first write inhibit signal input buffer 130 and the second write inhibit signal input buffer 140. The first write inhibit signal input buffer 130 and the second write inhibit signal input buffer 140 are turned on when the control signal PBPUB is asserted. The first write inhibit signal input buffer 130 and the second write inhibit signal input buffer 140 produce a first group control signal DMT1 and a second group control signal DMT2, respectively, in response to the first write inhibit signal DM1 and the second write inhibit signal DM2, which are input via control signal input pins 320.

The data output selection circuit 150 includes a first output controller 151, a second output controller 152, and a third output controller 153. The first output controller 151 produces the first output control signal PTRST in response to the data read signal READ output from the command decoder 110. The first output control signal PTRST is asserted in response to assertion of the data read signal READ and is then de-asserted after a predetermined time.

The MRS signal MRS and the first group control signal DMT1 are input to the second output controller 152, and the MRS signal MRS and the second group control signal DMT2 are input to the third output controller 153. When the MRS signal MRS is asserted and the first group control signal DMT1 is asserted, the second output controller 152 asserts a second output control signal RDDM1. When the MRS signal MRS is asserted and the second group control signal DMT2 is asserted, the third output controller 153 asserts a third output control signal RDDM2.

The first data output unit 160 includes a first set of data output circuits 163, each including a first DQ buffer 161 and first driver 162. The second data output unit 170 includes a second set of data output circuits 173, each including a second DQ buffer 171 and second driver 172. A first input/output pin group 330 is connected to the first data output unit 160. A second input/output pin group 340 is connected to the second data output unit 170. The first input/output pin group 330 includes a plurality of first data input/output pins 331. The second input/output pin group 340 includes a plurality of second data input/output pins 341.

In a test configuration, data input/output pins 331 and 341 of the respective first input/output pin group 330 and the second input/output pin group 340 are connected to a testing instrument by a common external data line. In a data read test, the data read test is repeated for each input/output pin group and in a data write test, data is written for the entire input/output pin group at a time.

Figure 9:
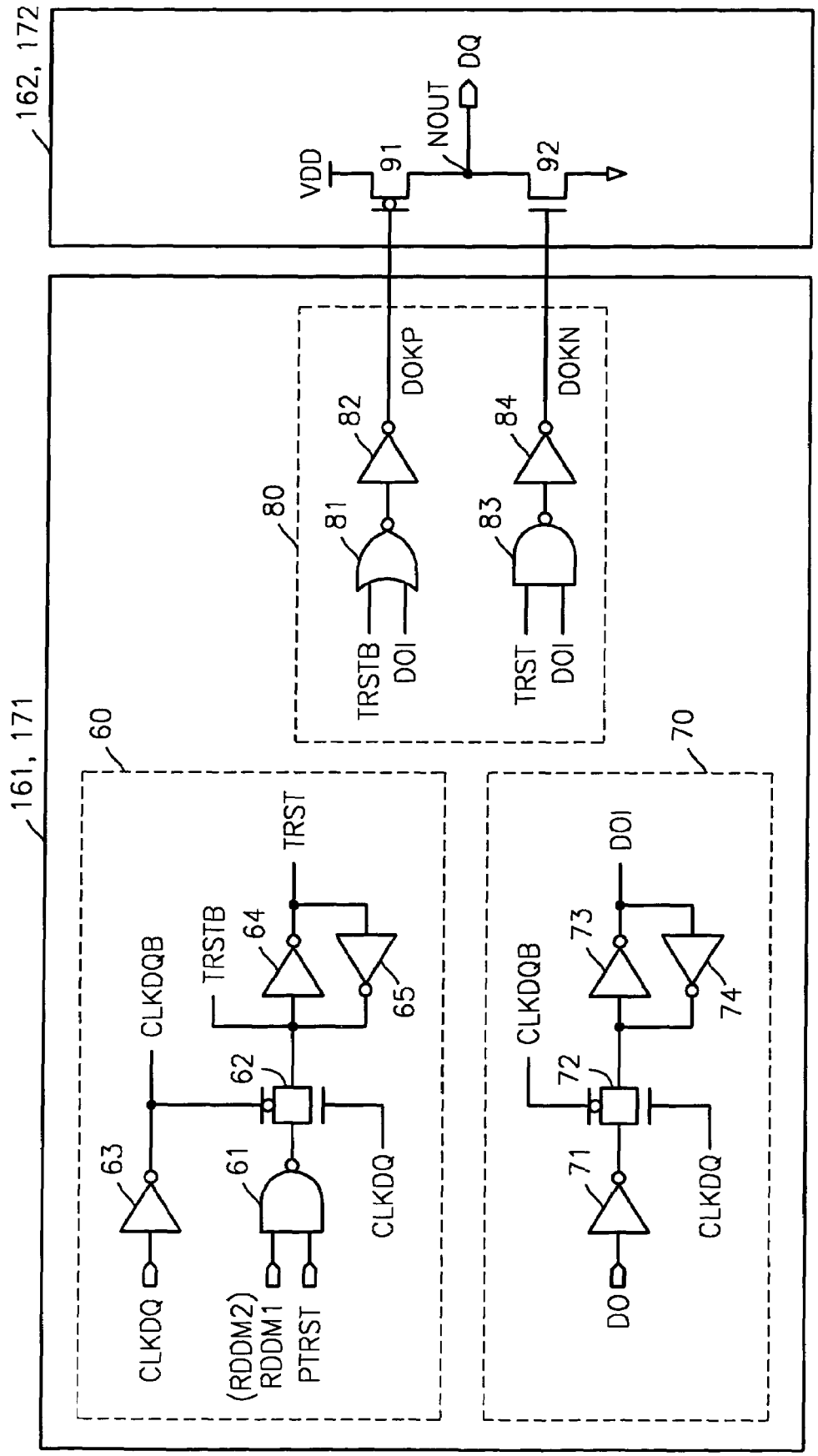
FIG. 9 is a block diagram of exemplary first and second DQ buffers and exemplary first and second drivers for the circuit of FIG. 4 according to some embodiments of the present invention.

The first DQ buffers 161 perform logical operations on the first output control signal PTRST, the second output control signal RDDM1, first group internal data DO0–DO7 on internal data lines 165 and the external clock signal and responsively output control signals DOKP and DOKN (see FIG. 9.) The first drivers 162 output first group data DQ0 to DQ7 according to the control signals DOKP and DOKN, or otherwise they change to a high impedance state and do not output the first group data DQ0 to DQ7. If the drivers change to the high impedance state, the drivers do not affect the data outputted from the data input/output pins connected to other drivers that are not at the high impedance state because the drivers at the high impedance state do not output data.

The second DQ buffers 171 perform logical operations on the first output control signal PTRST, the third output control signal RDDM2, second group internal data DO8 to DO15 on internal data lines 175, and the external clock signal and responsively produce control signals DOKP and DOKN (see FIG. 9 and description thereof, below). The second drivers 172 output second group data DQ8 to DQ15 according to the control signals DOKP and DOKN, or otherwise they change to a high impedance state and do not output the second group data DQ8 to DQ15. The first DQ buffers 161 and the first drivers 162 output the first group data DQ0 to DQ7 when the second output control signal RDDM1 is asserted. If the second output control signal RDDM1 is de-asserted, even though the first output control signal PTRST is in the asserted state, the first DQ buffers 161 and the first drivers 162 change to the high impedance state.

The second DQ buffers 171 and the second drivers 172 output the second group data DQ8 to DQ15 when the third output control signal RDDM2 is asserted. If the third control signal RDDM2 is de-asserted, even though the first output control signal PTRST is in the asserted state, the second DQ buffers 171 and the second drivers 172 change to the high impedance state. The first drivers 162 and the second drivers 172 may possess a relatively large capacity for driving currents, so that output of the first group internal data DO0 to DO7 or the second group internal data DO8 to DO15 to a large external load capacitance at a high speed is possible.

Figure 2:
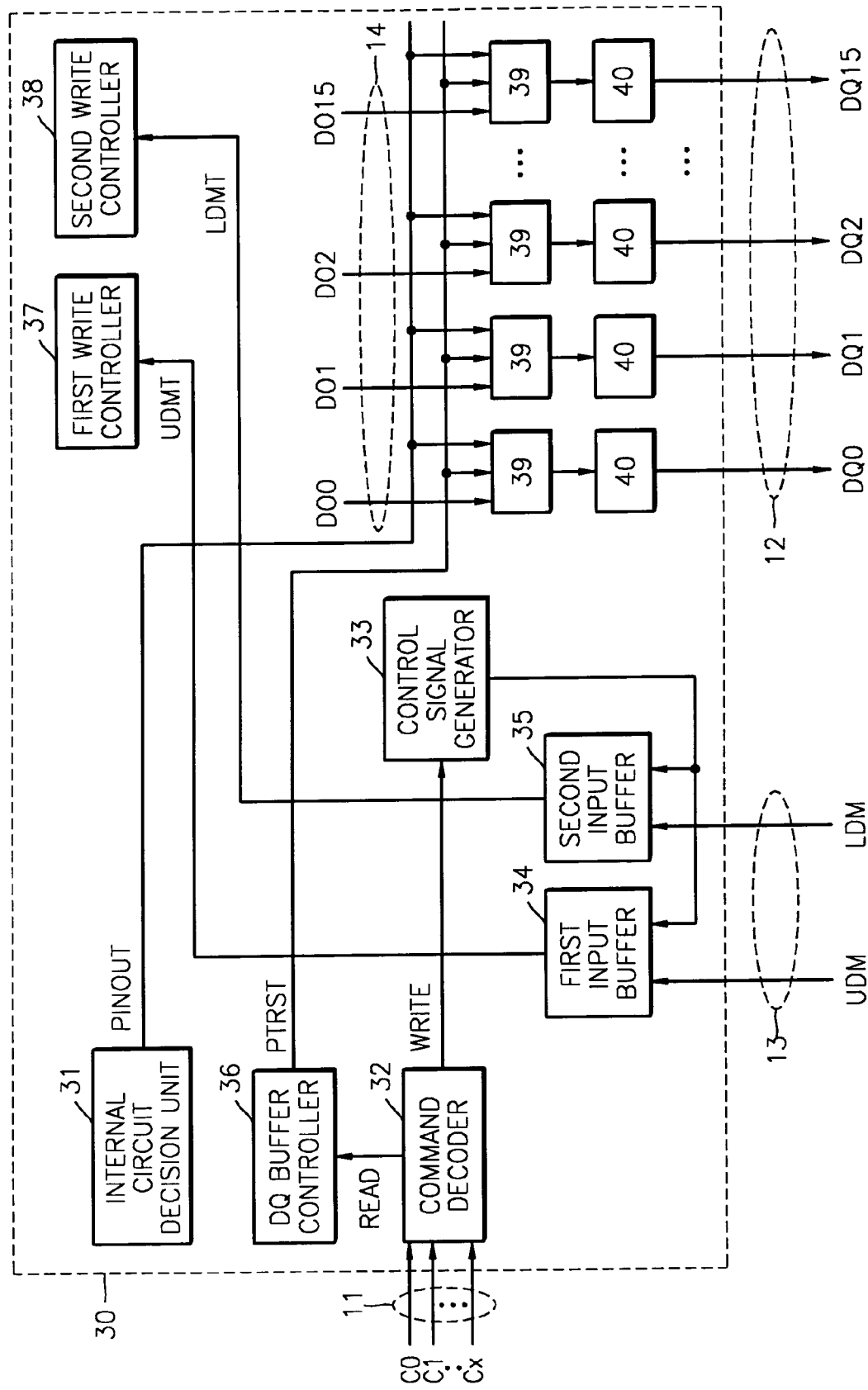
FIG. 2 is a block diagram of an internal circuit of the DDR SDRAM shown in the FIG. 1.
Figure 3:
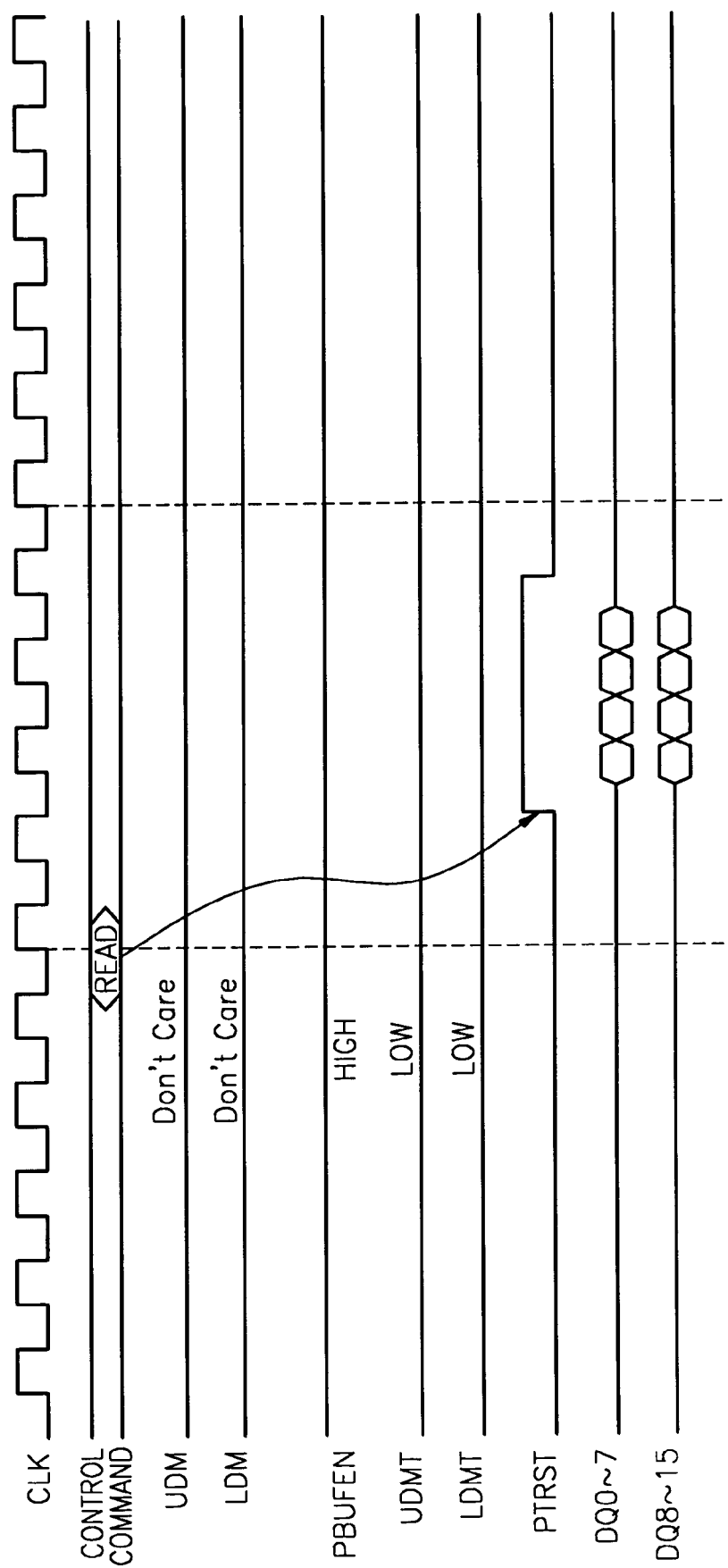
FIG. 3 is a timing chart for main input/output signals of the internal circuit of the DDR SDRAM shown in FIG. 2.

The configurations and detailed operations of the internal circuit decision unit 31, the first write controller 37, and the second write controller 38 are the same as those mentioned in the foregoing description of FIG. 2 and will not be described in greater detail. In FIG. 4, only a first data output unit 160 and a second data output unit 170 are shown, but it will be appreciated that the first data output unit 160 can further include a plurality of first sub data output units, and the second data output unit 170 can further include a plurality of second sub data output units. The second output controller 152 can further include a plurality of second sub output controllers to control the plurality of the first sub data output units. The third output controller 153 can further include a plurality of third sub output controllers to control the plurality of the second sub data output units. The first write inhibit signal input buffer 130 can output a plurality of second group control signals to control the plurality of the second sub output controller, and the second write inhibit signal input buffer 140 can output a plurality of third group control signals to control the plurality of the third sub output controllers.

Figure 5:
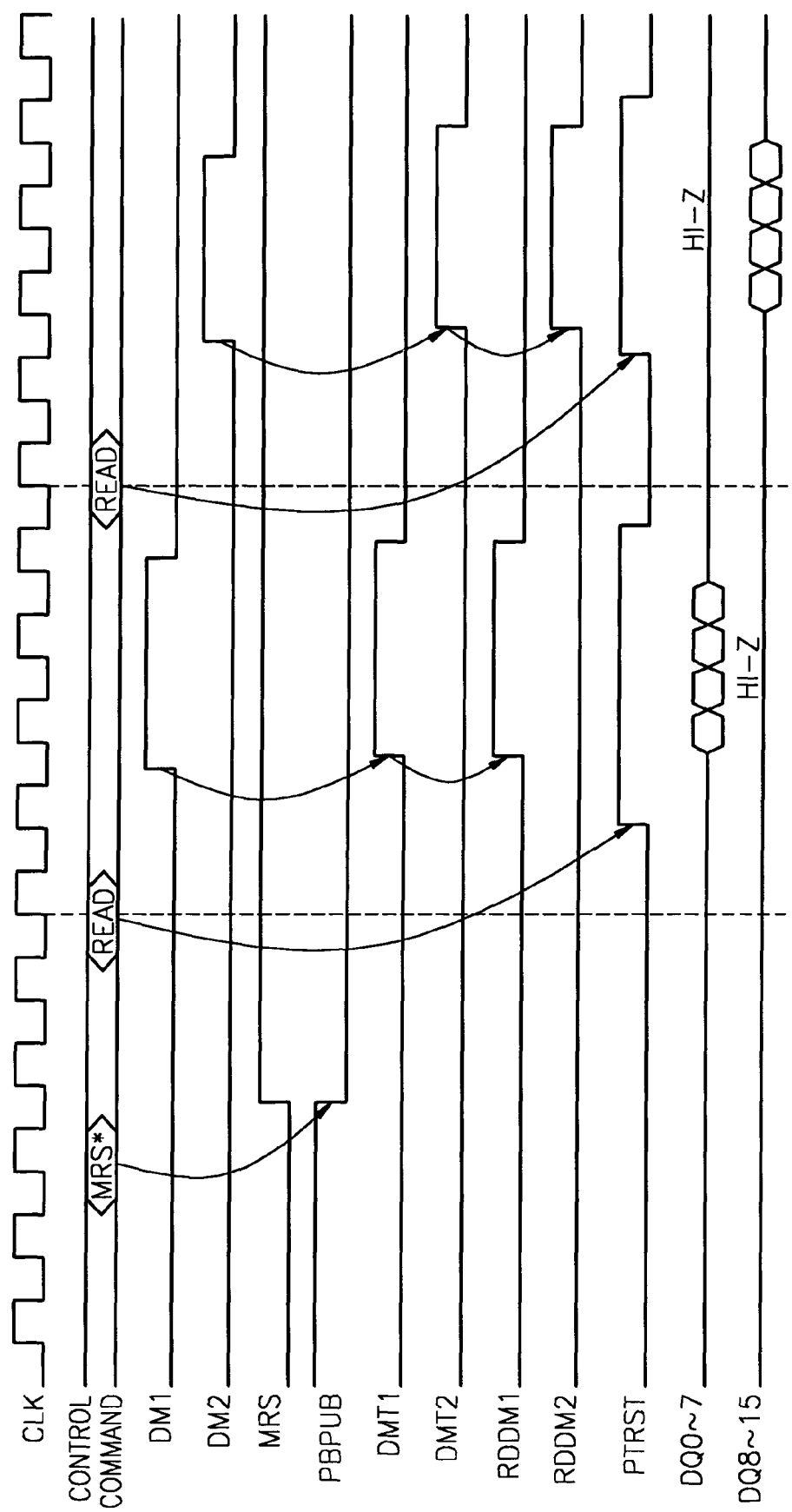
FIG. 5 is a timing chart illustrating exemplary operations of the internal circuit shown in FIG. 4.

FIG. 5 is a timing chart illustrating exemplary operations for the internal circuit shown in FIG. 4. If the plurality of externally input signals /CS, /RAS, /CAS and /WE are input to a control signal input pin 310 by a testing instrument, the command decoder 110 asserts an MRS signal MRS to command the DDR SDRAM to enter into test mode. As the MRS signal MRS is asserted, the write inhibit signal input buffer controller 120 asserts the control signal PBPUB, turning on the first write inhibit signal input buffer 130 and the second write inhibit signal input buffer 140. The externally input signals /CS, /RAS, /CAS and /WE are then applied to the control signal input pin 310, and the command decoder 110 asserts the first data read signal READ. In response, the first output controller 151 asserts the first output control signal PTRST for a predetermined time interval.

The first write inhibit signal DM1 and the second write inhibit signal DM2 are applied to the first write inhibit signal input buffer 130 and the second write inhibit signal input buffer 140 by the testing instrument. The first write inhibit signal DM1 and the second write inhibit signal DM2 are used to divide data output from the data input/output pins of the DDR SDRAM into groups and to sequentially read data in the groups. If the first write inhibit signal DM1 is asserted, the first group data DQ0 to DQ7 are output by the first DQ buffers 161 and the first drivers 162. If the second write inhibit signal DM2 is asserted, the second group data DQ8 to DQ15 are output by the second DQ buffers 171 and the second drivers 172. In the operations shown in FIG. 5, the first group data DQ0 to DQ7 are output and then the second group data DQ8 to DQ15 are output.

When the first write inhibit signal DM1 is asserted and the second write inhibit signal DM2 is de-asserted by the testing instrument, the first write inhibit signal input buffer 130 activates the first group control signal DMT1. The second write inhibit signal input buffer 140 outputs the second group control signal DMT2 in the de-asserted state because the second write inhibit signal DM2 is in the de-asserted state. The second output controller 152 asserts the second output control signal RDDM1 when the first group control signal DMT1 is asserted. Because the second group control signal DMT2 is in the de-asserted state, the third output controller 153 de-asserts the third output control signal RDDM2.

The first DQ buffers 161 and the first drivers 162 output the data DQ0–DQ7 when the second output control signal RDDM1 is asserted. The second DQ buffers 171 and the second drivers 172 change to the high impedance state and do not output the data DQ8 to DQ15 because the third output control signal RDDM2 is de-asserted.

Thereafter, the command decoder 110 asserts the data read signal READ again, and an inactive first write inhibit signal DM1 and an active second write inhibit signal DM2 are input by the testing instrument. Similar to the first data read operation, when the second write inhibit signal DM2 is asserted, the second group control signal DMT2 and the third output control signal RDDM2 are asserted, and the second DQ buffer 171 and the second driver 172 output the data DQ8–DQ15. The first DQ buffers 161 and the first drivers 162 change to the high impedance state and do not output the data DQ0–DQ7 because the second output control signal RDDM1 is in the de-asserted state.

Figure 6:
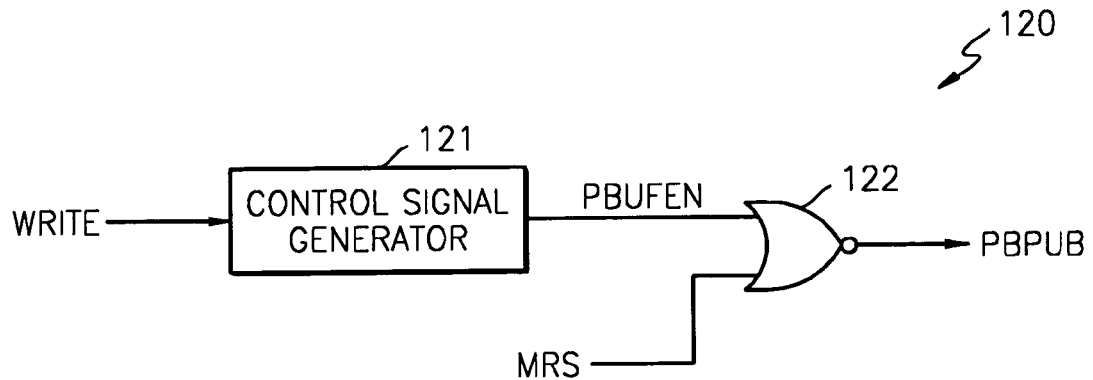
FIG. 6 is a block diagram of an exemplary write inhibit signal input buffer controller for the circuit of FIG. 4 according to some embodiments of the present invention.

As shown in FIG. 6, a write inhibit signal input buffer controller 120 according to some embodiments of the present invention may include a control signal generator 121 and a logic circuit 122. Since the configuration and the detailed operation of the control signal generator 121 are the same as those of the control signal generator 33 of FIG. 2, they will not be described in greater detail. The logic circuit 122 receives a control signal PBUFEN output from the control signal generator 121 and a MRS signal MRS output from the command decoder 110 and outputs a control signal PBPUB. Preferably, the logic circuit 122 is a NOR gate. In a test mode, the MRS signal MRS is high irrespective of the level, i.e., high or low, of the control signal PBUFEN, so the logic circuit 122 always holds the control signal PBPUB low. Accordingly, if the MRS signal MRS is asserted high, the first write inhibit signal input buffer 130 and the second write inhibit signal input buffer 140 are turned on.

Figure 7:
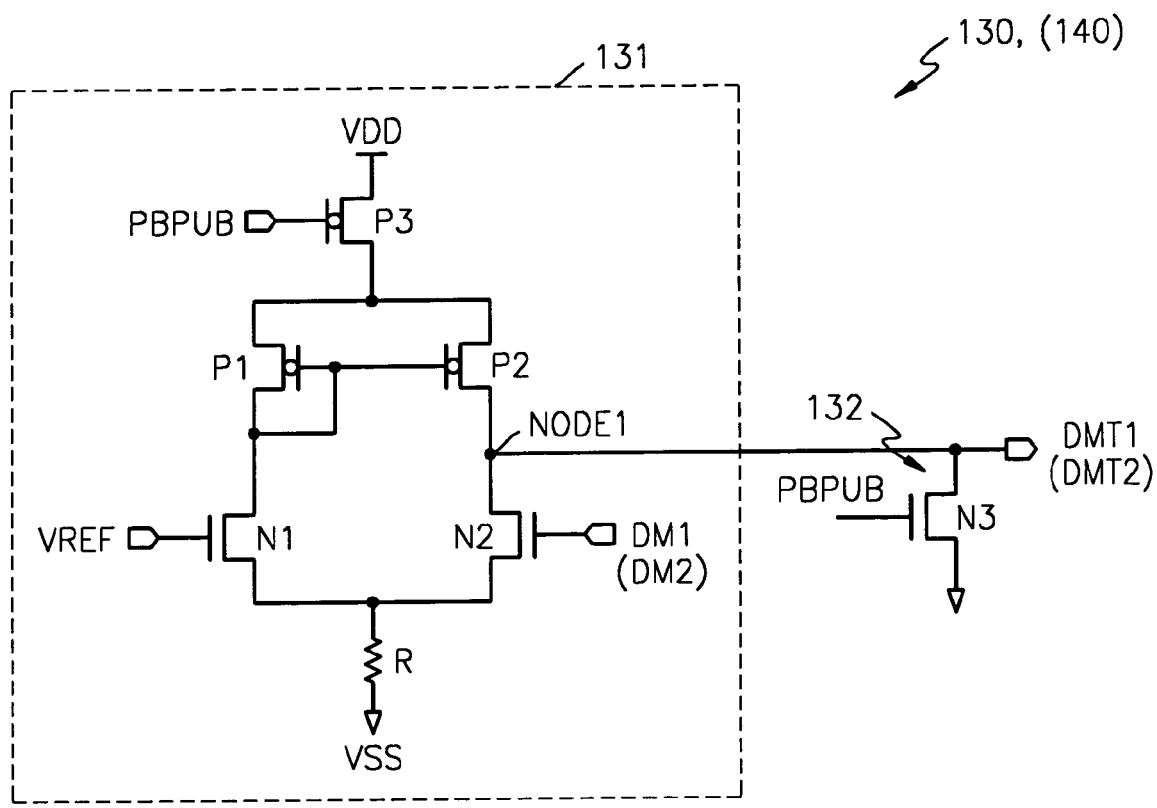
FIG. 7 is a block diagram of exemplary first and second write inhibit signal input buffers for the circuit of FIG. 4 according to some embodiments of the present invention.

FIG. 7 shows an exemplary implementation for the first and second write inhibit signal input buffers 130, 140 of the circuit of FIG. 4. The buffers may include a voltage comparison circuit 131 and an output control circuit 132. The voltage comparison circuit 131, in response to the control signal PBPUB, compares a voltage level of a reference voltage VREF with a voltage level of the write inhibit signal DM1 (or DM2) having a first voltage level and outputs a corresponding control signal DMT1 (or DMT2) having a second voltage level.

The voltage comparison circuit 131 may include a differential amplifier, including a first P-channel metal-oxide silicon (Pmos) load transistor P1 and a second Pmos load transistor P2, a first N-channel metal-oxide silicon (Nmos) differential transistor N1 and a second Nmos differential transistor N2, a Pmos switching transistor P3 and a load R. The first Pmos load transistor P1 and the second Pmos load transistor P2 form a current mirror. The first Nmos differential transistor N1 and the second Nmos differential transistor N2 input the write inhibit signal DM1 (or DM2) to a gate, compare the voltage level of the inhibit signals DM1 (or DM2) with the voltage level of the reference voltage VREF, and output the control signal DMT1 (or DMT2). The reference voltage VREF may be generated by an additional reference voltage generating circuit (not shown) and preferably has a substantially constant voltage level.

In response to the control signal PBPUB, the Pmos switching transistor P3 turns the differential amplifier on/off. The Pmos switching transistor P3, a drain of which is connected to the sources of the first Pmos load transistor P1 and the second Pmos load transistor P2 and a source of which is connected to an internal voltage VDD, input the control signal PBPUB to a gate. The output control circuit 132 pulls the control signal DMT1 (or DMT2) to a signal ground when the voltage comparison circuit 131 is in an off state. The output control circuit 132 may include an Nmos transistor N3. The Nmos transistor N3, a drain of which is connected to the output of the voltage comparison circuit 131 and a source of which is connected to the signal ground, input the control signal PBPUB to a gate.

The operation of the first write inhibit signal input buffer 130 will now be described. If the control signal PBPUB is driven at a low level from the write inhibit signal input buffer controller 120 as shown in FIG. 4, the Pmos switching transistor P3 and the voltage comparison circuit 131 are turned on. The voltage comparison circuit 131 compares the voltage level of the reference voltage with the voltage level of the first write inhibit signal DM1 (or DM2) and outputs the first group control signal DMT1 (or DMT2). The output control circuit 132 is turned off because the control signal PBPUB is low. If the control signal PBPUB is high, the voltage comparison circuit 131 is turned off and the output control circuit 132 is turned on, and as a result, the first group control signal DMT1 (or DMT2) is pulled to the signal ground.

Figure 8:
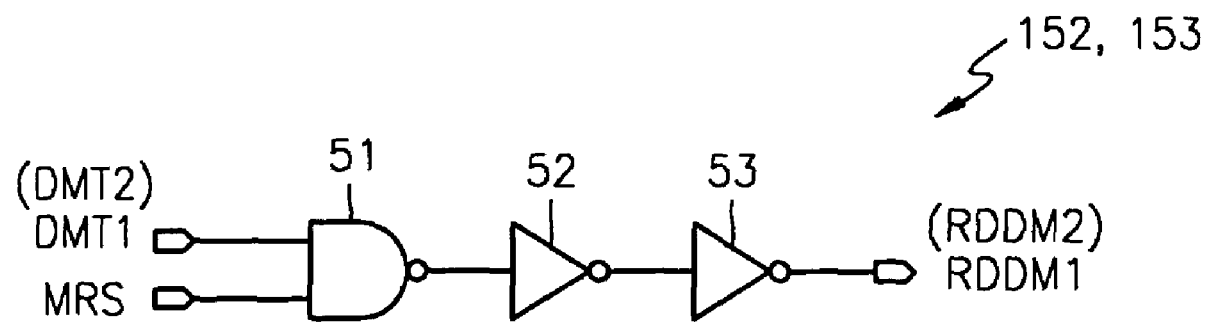
FIG. 8 is a block diagram of exemplary second and third output controllers for the circuit of FIG. 4 according to some embodiments of the present invention.

FIG. 8 is a block diagram of an exemplary implementation of the second and third output controllers 152, 153 of FIG. 4 according to some embodiments of the present invention. As shown in FIG. 8, the second output controller 152 and the third output controller 153 may include a NAND gate 51 and inverters 52 and 53. The NAND gate 51 receives the control signal DMT1 (or DMT2) output from the write inhibit signal input buffer 130 or 140 and the MRS signal MRS. The inverters 52 and 53 responsively produce the output control signal RDDM1 (or RDDM2).

FIG. 9 is a block diagram showing an exemplary implementation of the first and second DQ buffers 161, 171 and the first and second drivers 162, 172 of FIG. 4 according to further embodiments of the present invention. The first and second DQ buffers 161, 171 include a first logic circuit 60, a second logic circuit 70, and a third logic circuit 80. The first logic circuit 60 receives the control signal RDDM1 (or RDDM2), the first output control signal PTRST, and an external clock signal CLKDQ, and responsively outputs a pair of internal control signals TRSTB and TRST. The first logic circuit 60 includes a NAND gate 61, a transmission gate 62, and inverters 63, 64, and 65. The NAND gate 61 performs a logical operation of the control signal RDDM1 (or RDDM2) and the first output control signal PTRST. The external clock signal CLKDQ and an external clock bar signal CLKDQB are input to the control terminals of the transmission gate 62. The external clock bar signal CKLDQB is an inverted form of the external clock signal CLKDQ, generated by the inverter 63. The transmission gate 62 is turned on by the external clock signal CLKDQ and the external clock bar signal CLKDQB.

The inverter 64 inverts the signal received from the NAND gate 61 through the transmission gate 62 and outputs the first internal control signal TRST. The inverter 65 inverts the first internal control signal TRST to produce the second internal control signal TRSTB.

The second logic circuit 70 synchronizes the data DO with the external clock signal CLKDQ, generating internal data DOI. The second logic circuit 70 includes inverters 71, 73, and 74 and a transmission gate 72. The inverter 71 inverts the data DO. The external clock signal CLKDQ and the external clock bar signal CLKDQB are applied to the control terminals of the transmission gate 72. The external clock bar signal CKLDQB is an inverted form of the external clock signal CLKDQ produced by the inverter 63. The transmission gate 72 is turned on by the external clock signal CLKDQ and the external clock bar signal CLKDQB. The inverter 73 inverts the signal that is output from the inverter 71 and passed through the transmission gate 72, and outputs the internal data DOI. The inverter 74 inverts the internal data DOI and outputs the inverted internal data DOI.

The third logic circuit 80 receives the first internal control signal TRST, the second internal control signal TRSTB, and the internal data DOI, and outputs control signals DOKN and DOKP. The third logic circuit 80 includes a NOR gate 81, a NAND gate 83, and inverters 82 and 84. The NOR gate 81 logically combines the second internal control signal TRSTB and the internal data DOI, and the inverter 82 inverts the output of the NOR gate 81 and outputs the control signal DOKP. The NAND gate 83 combines the first internal control signal TRST and the internal data DOI. The inverter 84 inverts the output of the NAND gate 83 and outputs the control signal DOKN. In the first DQ buffers 161, the signal input to the inverter 71 is the first group internal data DO0 to DO7, while in the second DQ buffer 171, the second group internal data DO8 to DO15 is input.

The drivers 162, 172 include a Pmos transistor 91 and an Nmos transistor 92. The Pmos transistor 91, a source of which is connected to an internal voltage VDD and a drain of which is connected to an output node NOUT, received the control signal DOKP at its gate. The Nmos transistor 92, a source of which is connected to a ground and a drain of which is connected to the output node NOUT, received the control signal DOKN at its gate.

The state of the data DQ according to the control signals DOKP and DOKN can be described as in table 1 displayed below.

TABLE 1

| DQ | DOKN | DOKP |
|---|---|---|
| HIGH | LOW | LOW |
| HI IMPEDANCE (HI-Z) | LOW | HIGH |
| FORIDDEN | HIGH | LOW |
| LOW | HIGH | HIGH |

As shown in Table 1, if the control signal DOKN is low and the control signal DOKP is high, the output node changes to a high impedance state and the data DQ is not output.

The first drivers 162 and the second drivers 172 are different from one another in that the signals output to the output node NOUT are different. In the first drivers 162, the signal outputs to the output node NOUT are the first group data DQ0 to DQ7 and in the second drivers 172, the second group data DQ8 to DQ15 is output.

Figure 10:
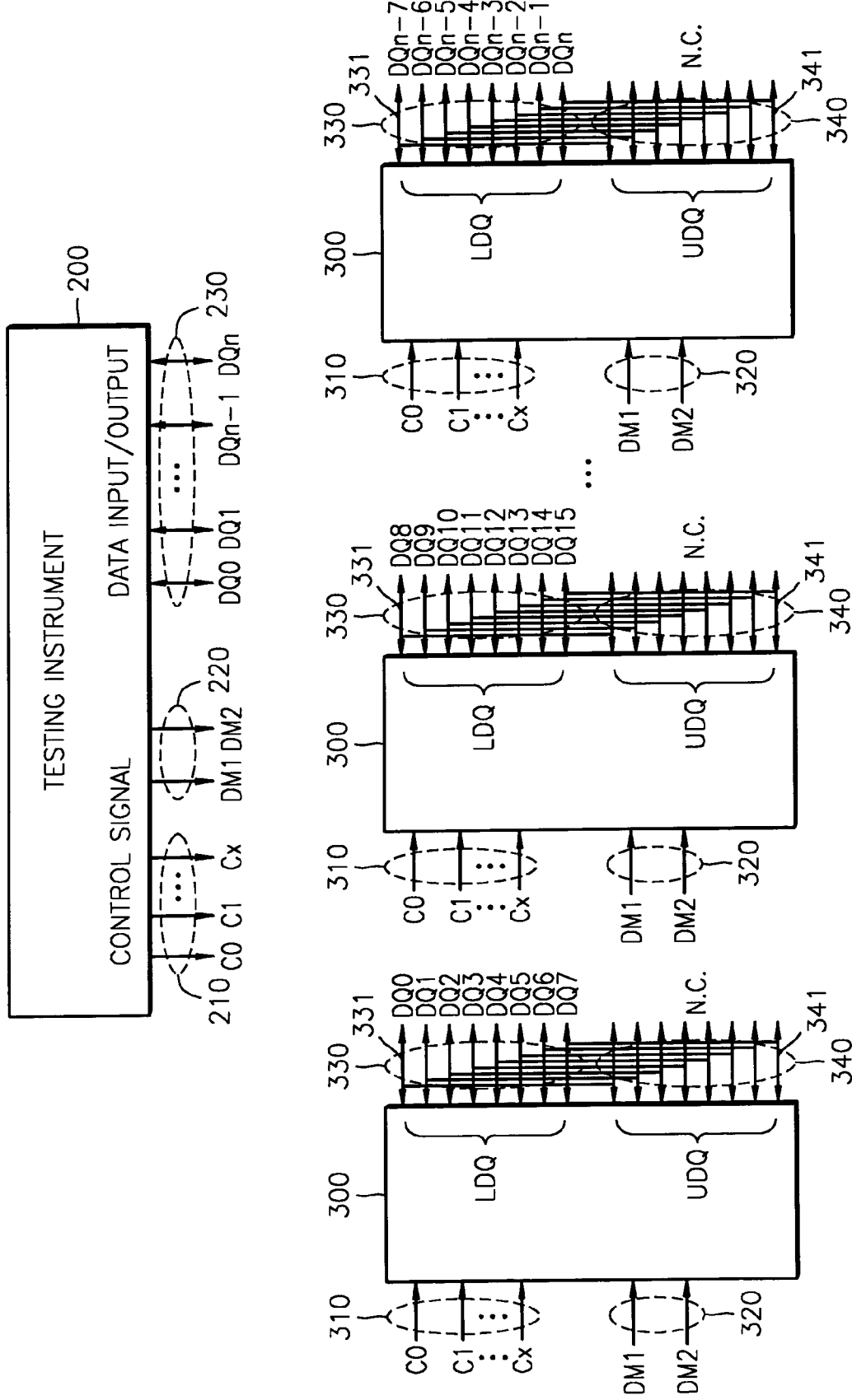
FIG. 10 is a block diagram showing a connection of DDR SDRAMs to a testing instrument, according to some embodiments of the present invention.

FIG. 10 is a block diagram showing an exemplary connection of a testing instrument to DDR SDRAMs having an internal circuit for improving test efficiency according to some embodiments of the present invention. As shown in FIG. 10, a testing instrument 200 includes a plurality of control signal output pins 210 and 220 and a plurality of data input/output pins 230. DDR SDRAMs 300 include control signal input pins 310 and 320 and input/output pin groups 330 and 340. The input/output pin groups 330 and 340 include data input/output pins 331 and 341, respectively. For performing a test, the data input/output pins 331 of the input/output pin group 330 and the data input/output pins 341 of the input/output pin group 340 are connected to each other by a conducting wire.

The control signal input pins 310 of the DDR SDRAMs 300 are connected to the control signal output pins 210. The control signal input pins 320 are connected to the control signal output pins 220. Only the data input/output pins 331 or 341 corresponding to one of the groups 330 and 340 of each DDR SDRAM 300 is connected to the plurality of data input/output pins 230, in a one-to-one relationship.

As described above, according to some embodiments of the present invention, data output for a DDR SDRAM can be limited to a data input/output pin groups, such that data input/output pins of one group among a plurality of input/output pin groups of a DDR SDRAM can be connected to input/output pins of the testing instrument. This can reduce the number of data input/output pins of an individual DDR SDRAM that are connected the testing instrument, and make it is possible to increase the number of DDR SDRAMs that are tested simultaneously with a single testing instrument.

Figure 11:
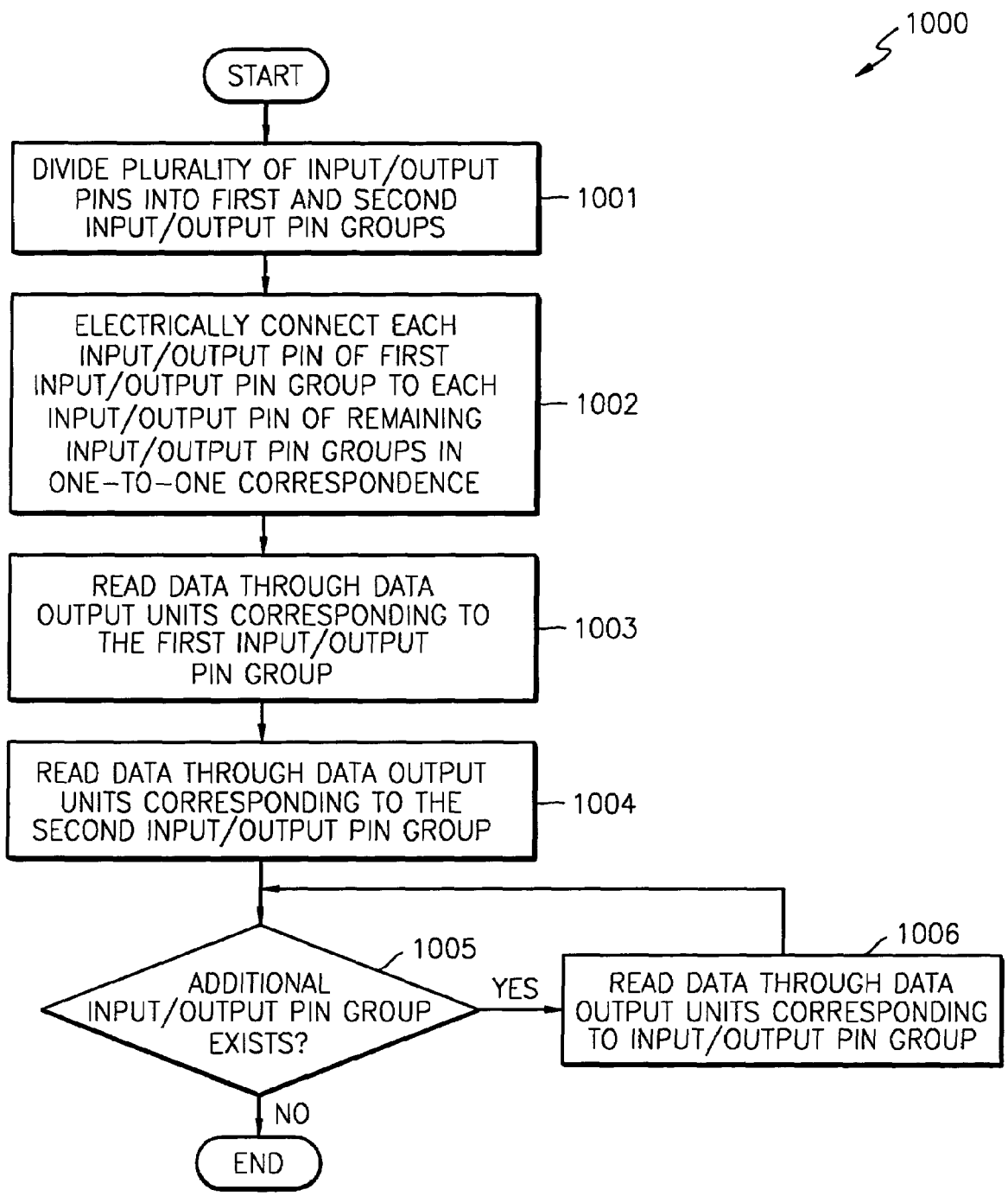
FIG. 11 is a flowchart showing exemplary test operations for a DDR SDRAM according to some embodiments of the present invention.

FIG. 11 is a flowchart showing exemplary testing operations 1000 for a DDR SDRAM having an internal circuit for improving test efficiency, according to some embodiments of the present invention. First, a plurality of input/output pins is divided into first and second input/output pin groups (step 1001). Then each input/output pin of the first input/output pin group is electrically interconnected to each input/output pin of the other input/output pin groups by a conductive wire in a one-to-one relationship (step 1002). Thereafter, data is read by the first data output units corresponding to the first input/output pin group (step 1003). When the data is output from a group of the first data output units, the data output units of the other groups change to the high impedance state. The data is read through the second data output units corresponding to the second input/output pin group (step 1004). Here, similarly to step 1003, the data output units of the other groups change to the high impedance state. Next, it is checked whether any additional input/output pin group, i.e., group of additional data output units, exists (step 1005). If an additional input/output pin group exists, a read test is performed by the data output unit corresponding to this input/output pin group and then the process returns to step 1005. If an additional group of data output units does not exist, the test is terminated.

Figure 12:
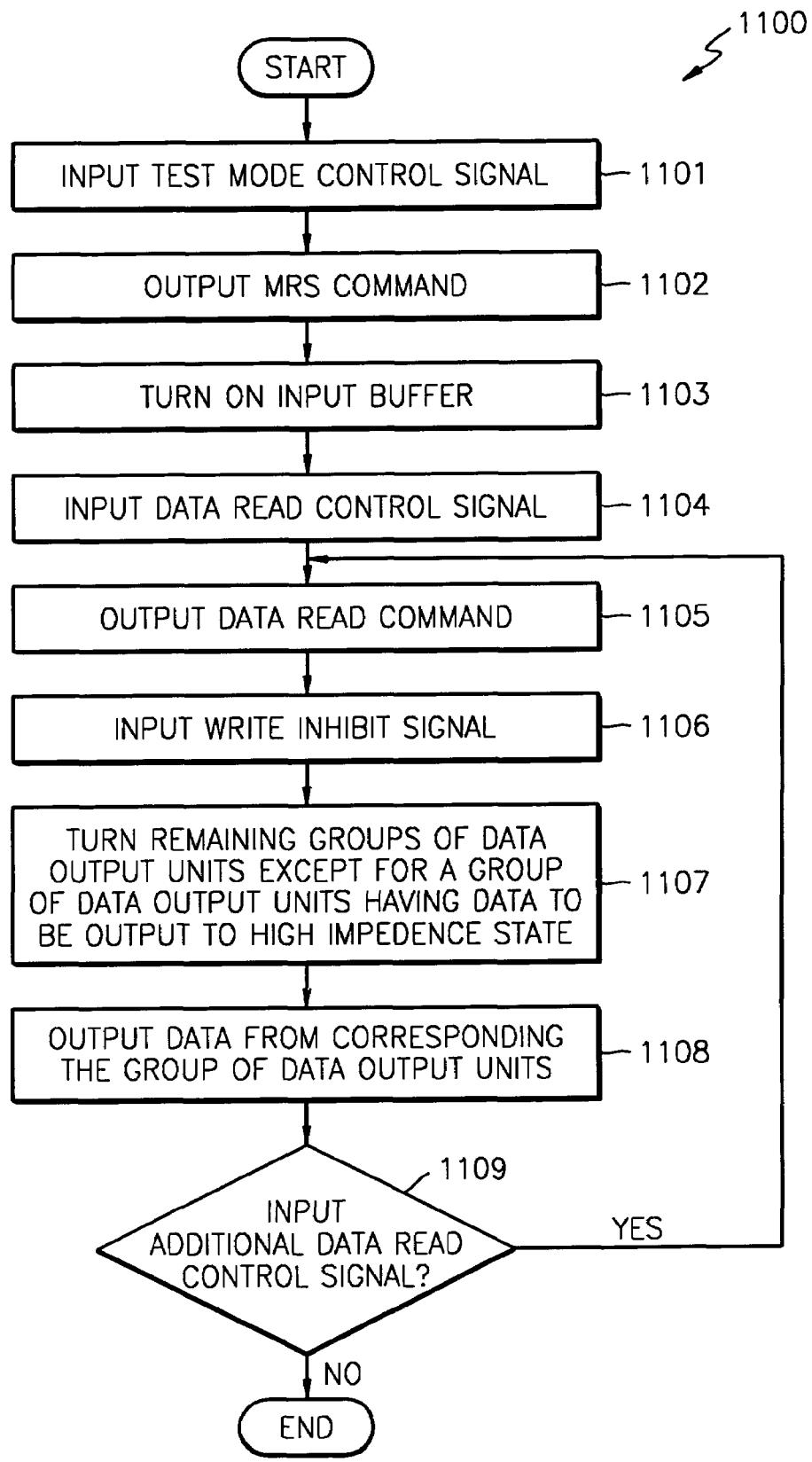
FIG. 12 is a flowchart showing exemplary test operations for a DDR SDRAM according to further embodiments of the present invention.

FIG. 12 is a detailed flowchart showing exemplary test operations 1100 that may be sued in test procedure shown in FIG. 11. First, the testing instrument outputs control signals C0, C1, . . . , CX, to the control signal input pin 310 of the DDR SDRAM to enter a test mode (step 1101). The command decoder 110 asserts the MRS signal MRS to enter test mode (step 1102). In response to the MRS signal, the first write inhibit signal input buffer 130 and the second write inhibit signal input buffer 140 are turned on by the control signal PBPUB output from the write inhibit signal input buffer controller 120 (step 1103). Next, a control signal for reading the data is applied to the command decoder 110 by the testing instrument (step 1104). Then, the command decoder 110 asserts the first data read signal READ (step 1105).

The first write inhibit signal DM1 and the second write inhibit signal DM2 are asserted at the first write inhibit signal input buffer 130 and the second write inhibit signal input buffer 140, respectively (step 1106). The first write inhibit signal input buffer 130 and the second write inhibit signal input buffer 140 respectively output the first group control signal DMT1 and the second group control signal DMT2 in response to the first write control signal DM1 and the second write control signal DM2. The second output controller 152 asserts the second output control signal RDDM1 in response to the first group control signal DMT1. The third output controller 153 asserts the third output control signal RDDM2 in response to the second group control signal DMT2. The other groups of data output units except for a group of data output units having the data to be output changes to the high impedance state responsive to the second output control signal RDDM1 and the third output control signal RDDM2 (step 1107). The data is then output from corresponding the group of data output units having the data to be output (step 1108). Next, it is checked whether a control signal for reading additional data is applied to the command decoder 110, and if the control signal is input, the process returns to step 1105 and the foregoing processes are repeated (step 1109). If the control signal for reading additional data is not applied, the data read test is terminated.

It will be appreciated that the present invention may also be embodied as computer program products comprising computer code configured to perform operations, such as those described with reference to FIGS. 11 and 12. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

The present invention is described herein with reference to flowchart and/or block diagram illustrations of methods, systems, computer data signals and computer program products in accordance with exemplary embodiments of the invention. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

While this invention has been particularly shown and described with reference to typical embodiments thereof, it will be understood by those skilled in the art that various changes in form and details may be made therein without departing from the spirit and scope of the invention as defined by the appended claims.

What is claimed is:

1. A memory device, comprising:
    a plurality of data output circuits, respective ones of which are configured to receive data from respective internal data lines and respective ones of which are coupled to respective data input/output pins; and
    a. data output control circuit operative to selectively enable subsets of the plurality of data output circuits to drive their respective corresponding data input/output pins responsive to an externally-applied control signal.

2. The memory device according to claim 1, wherein the data output control circuit is operative to selectively cause the subsets of the plurality of data output circuits to present a high impedance at their respective corresponding data input/output pins.

3. The memory device according to claim 1, wherein the data output control circuit comprises:
    a command decoder operative to generate test mode command signals and read command signals responsive to the first externally-applied control signals; and
    a data output selection circuit coupled to the command decoder and operative to selectively enable the subsets of the plurality of data output circuits responsive to the test mode command signals, the read command signals, and second externally-supplied control signals.

4. The memory device according to claim 3:
    wherein the data output selection circuit comprises:
    a data output controller circuit configured to receive a plurality of group control signals and operative to generate respective output control signals responsive to respective ones of the group control signals; and
    a plurality of write inhibit signal input buffer circuits, respective ones of which are configured to receive respective ones of a plurality of externally-applied write inhibit signals and operative to generate respective ones of the group control signals therefrom; and
    wherein respective subsets of the plurality of data output circuits are configured to receive respective ones of the output control signals and are operative to be enabled and disabled responsive thereto.

5. The memory device according to claim 4, wherein the data output controller circuit comprises:
    a first data output controller circuit that applies an enable signal to all of the plurality of data output circuits responsive to a read command signal generated by the command decoder;
    a second data output controller circuit that receives a first group control signal and that generates a first group enable signal for a first subset of the plurality of data output circuits; and
    a third data output controller circuit that receives a second group control signal and that generates a second group enable signal for a second subset of the plurality of data output circuits.

6. The memory device according to claim 4, wherein the data output control circuit further comprises a write inhibit signal input buffer control circuit operative to enable the plurality of write inhibit signal input buffer circuits responsive to a test mode command signal generated by the command decoder.

7. The memory device according to claim 6, wherein the write inhibit signal input buffer control circuit further comprises:
   a control signal generator circuit which outputs a write inhibit signal buffer control signal in response to a data write command signal from the command decoder; and
   a logic circuit that logically combines the write inhibit signal buffer control signal and the test mode signal and responsively applies a write inhibit signal buffer enable signal to the plurality of write inhibit signal input buffer circuits.

8. The memory device according to claim 7, wherein a write inhibit signal input buffer circuit of the plurality of write inhibit signal input buffer circuits comprises:
   a voltage comparison circuit which, in response to a first state of a first write inhibit buffer enable signal, compares a write inhibit signal to a reference voltage and outputs a first group control signal responsive to the comparison; and
   an output control circuit, which, in response to a second state of the first write inhibit signal buffer enable signal, forces the first group control signal to a signal ground voltage.

9. The memory device according to claim 4, wherein a data output circuit of the plurality of data output circuits comprises:
   a data input/output (DQ) buffer circuit configured to receive data from an internal data line and an output control signal from the data output controller circuit and operative to generate a synchronized data signal synchronized to an external clock signal in response thereto; and
   a driver circuit that drives an input/output pin responsive to the synchronized data signal.

10. The memory device according to claim 1, configured to operate as a double date rate synchronous dynamic random access memory (DDR SDRAM).

11. A method of testing a memory device comprising a plurality of data output circuits, respective ones of which are configured to receive data from respective internal data lines and respective ones of which are coupled to respective data input/output pins of the memory device, the method comprising:
   applying a control signal to the memory device to selectively enable a subset of the plurality of data output circuits to drive a load at their respective corresponding data input/output pins.

12. The method according to claim 11, further comprising:
   connecting data input/output pins coupled to first and second data output circuits of respective first and second subsets of the plurality of data output circuits in common to an external data line; and
   alternately enabling the first and second data output circuits responsive to the control signal to drive the external data line with data from first and second different internal data lines of the memory device.

13. The method according to claim 12, wherein the first data output circuit presents a high impedance to the external data line when the second data output circuit is enabled.

14. The method according to claim 12, wherein alternately enabling the first and second data output circuits responsive to the control signal to drive the external data line with data from first and second different internal data lines of the memory device comprises:
   generating a test mode command signal from a command decoder of the memory device;
   enabling a plurality of write inhibit signal input buffers of the memory device responsive to the test mode command signal;
   generating a first read command signal from the command decoder; transitioning a first write inhibit signal at an input of a first write inhibit buffer of the memory device;
   enabling the first subset of the plurality of data output circuits responsive to the first read command signal and to the transition of the first write inhibit signal to thereby drive a set of external data lines with data from a first set of internal data lines;
   generating a second read command signal from the command decoder;
   transitioning a second write inhibit signal at an input of a second write inhibit buffer;
   enabling the second subset of the plurality of data output circuits responsive to the second read command signal and to the transition of the second write inhibit signal to thereby drive the set of external data lines with data from a second set of internal data lines.

* * * * *